United States Patent
Iwasaki et al.

(10) Patent No.: US 9,634,170 B2
(45) Date of Patent: Apr. 25, 2017

(54) CONCENTRATOR PHOTOVOLTAIC PANEL, CONCENTRATOR PHOTOVOLTAIC, AND CONCENTRATOR PHOTOVOLTAIC SYSTEM

(75) Inventors: Takashi Iwasaki, Osaka (JP); Masanobu Koganeya, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 14/125,277

(22) PCT Filed: Jun. 8, 2012

(86) PCT No.: PCT/JP2012/064804
§ 371 (c)(1),
(2), (4) Date: Dec. 10, 2013

(87) PCT Pub. No.: WO2012/169618
PCT Pub. Date: Dec. 13, 2012

(65) Prior Publication Data
US 2014/0124016 A1  May 8, 2014

(30) Foreign Application Priority Data

Jun. 10, 2011  (JP) .................................. 2011-129973

(51) Int. Cl.
*H02S 20/32* (2014.01)
*F24J 2/08* (2006.01)
(Continued)

(52) U.S. Cl.
CPC .......... *H01L 31/0543* (2014.12); *H01L 31/02* (2013.01); *H02S 20/32* (2014.12);
(Continued)

(58) Field of Classification Search
CPC . H01L 31/0232; H01L 31/0524; H01L 27/30; H01L 27/3269; H01L 31/0547;
(Continued)

(56) References Cited

U.S. PATENT DOCUMENTS 5,725,006 A * 3/1998 Kawama et al. ............. 136/251
6,084,713 A * 7/2000 Rosenthal .................... 359/619
(Continued)

FOREIGN PATENT DOCUMENTS

CN      1671548 A   9/2005
CN    101030608 A   9/2007
(Continued)

OTHER PUBLICATIONS

Office Action in corresponding Japanese Application No. 2011-129973, mailed Dec. 11, 2012, 5 pages.
(Continued)

*Primary Examiner* — Allison Bourke
*Assistant Examiner* — Michael Y Sun
(74) *Attorney, Agent, or Firm* — Ditthavong & Steiner, P.C.

(57) ABSTRACT

A concentrator photovoltaic is formed by concentrator photovoltaic panels each having solar cells arranged on the back side of concentrating lenses. A plurality of portions of an image are imaged at the periphery of each of the solar cells in each of the panels. When each of the panels tracks the sun to be swung in the right-left direction and in the up-down direction, an image which can be identified through the concentrating lenses by a person who sees the image from a position in front of the concentrator photovoltaic is different according to an angle at which the panel is swung (direction rotation angle and elevation angle) due to the characteristic of the concentrating lenses. Therefore, the image of a letter or the like which appears with movement of the sun can be
(Continued)

changed, and a message or the like according to time thereof can be displayed.

9 Claims, 11 Drawing Sheets

(51) Int. Cl.
*H01L 31/02* (2006.01)
*H01L 31/054* (2014.01)

(52) U.S. Cl.
CPC .................. *F24J 2/08* (2013.01); *Y02E 10/40* (2013.01); *Y02E 10/52* (2013.01)

(58) Field of Classification Search
CPC ..... H01L 31/0543; H01L 31/02; H02S 20/32; Y02E 10/52; Y02E 10/40; G02B 5/201; G02B 27/2214; H01M 14/005; G03B 21/602; H01S 20/32; F24J 2/08; G09F 9/3026; G09F 9/33; G09F 9/35
USPC ...................... 136/251, 246; 257/84; 359/619
See application file for complete search history.

(56) References Cited

U.S. PATENT DOCUMENTS

2009/0133737 A1* 5/2009 Anzawa ................ F24J 2/5235
  136/246
2013/0153934 A1* 6/2013 Meitl .................... G09F 9/3026
  257/84

FOREIGN PATENT DOCUMENTS

| JP | 8204220 A | 8/1996 | |
| JP | 2002289896 A | 10/2002 | |
| JP | 200329685 A | 1/2003 | |
| JP | 2005101209 A | 4/2005 | |
| JP | 2005116834 A | 4/2005 | |
| JP | 2005142373 A | 6/2005 | |
| JP | 3860778 B2 | 12/2006 | |
| JP | 2007201109 A | 8/2007 | |
| JP | 20084661 A | 1/2008 | |
| JP | 200815048 A | 1/2008 | |
| JP | WO 2009063822 A1 * | 5/2009 | ................ F24J 2/12 |
| JP | 2010192468 A | 9/2010 | |
| JP | 2013535100 A | 9/2013 | |
| WO | 2007085721 A1 | 8/2007 | |
| WO | 2009063822 A1 | 5/2009 | |
| WO | WO 2009063822 A1 * | 5/2009 | |
| WO | 2009128422 A1 | 10/2009 | |
| WO | 2010067029 A1 | 6/2010 | |

OTHER PUBLICATIONS

Office Action in corresponding Japanese Application No. 2011-129973, mailed May 7, 2013, 6 pages.
Decision of Refusal in corresponding Japanese Application No. 2011-129973, mailed Nov. 12, 2013, 4 pages.
International Search Report for corresponding Application No. PCT/JP2012/064804, date of mailing Jul. 3, 2012, 2 pages.
Chinese Office Action for related Chinese Patent Application No. 201280027869.4 dated Aug. 3, 2015, 19 Pages.

* cited by examiner

CONCENTRATOR PHOTOVOLTAIC PANEL, CONCENTRATOR PHOTOVOLTAIC, AND CONCENTRATOR PHOTOVOLTAIC SYSTEM

TECHNICAL FIELD

The present invention relates to a concentrator photovoltaic panel, a concentrator photovoltaic, and a concentrator photovoltaic system, which have properties of displayability and decorativeness.

BACKGROUND ART

In a photovoltaic power generation panel, it is general that a large number of solar cells are arrayed to be adjacent to each other in a plane, and the entire light receiving surface thereof is black due to specialty of absorbing light.

On the other hand, there is a concentrator photovoltaic panel which concentrates sunlight by each concentrating lens, such as a Fresnel lens, to radiate each solar cell and condenses solar energy to generate power. Attention has been given to the concentrator photovoltaic panel which is installed on a base which tracks the sun to have high power generation efficiency per installed area (see Patent Literature 1).

Figure 2:
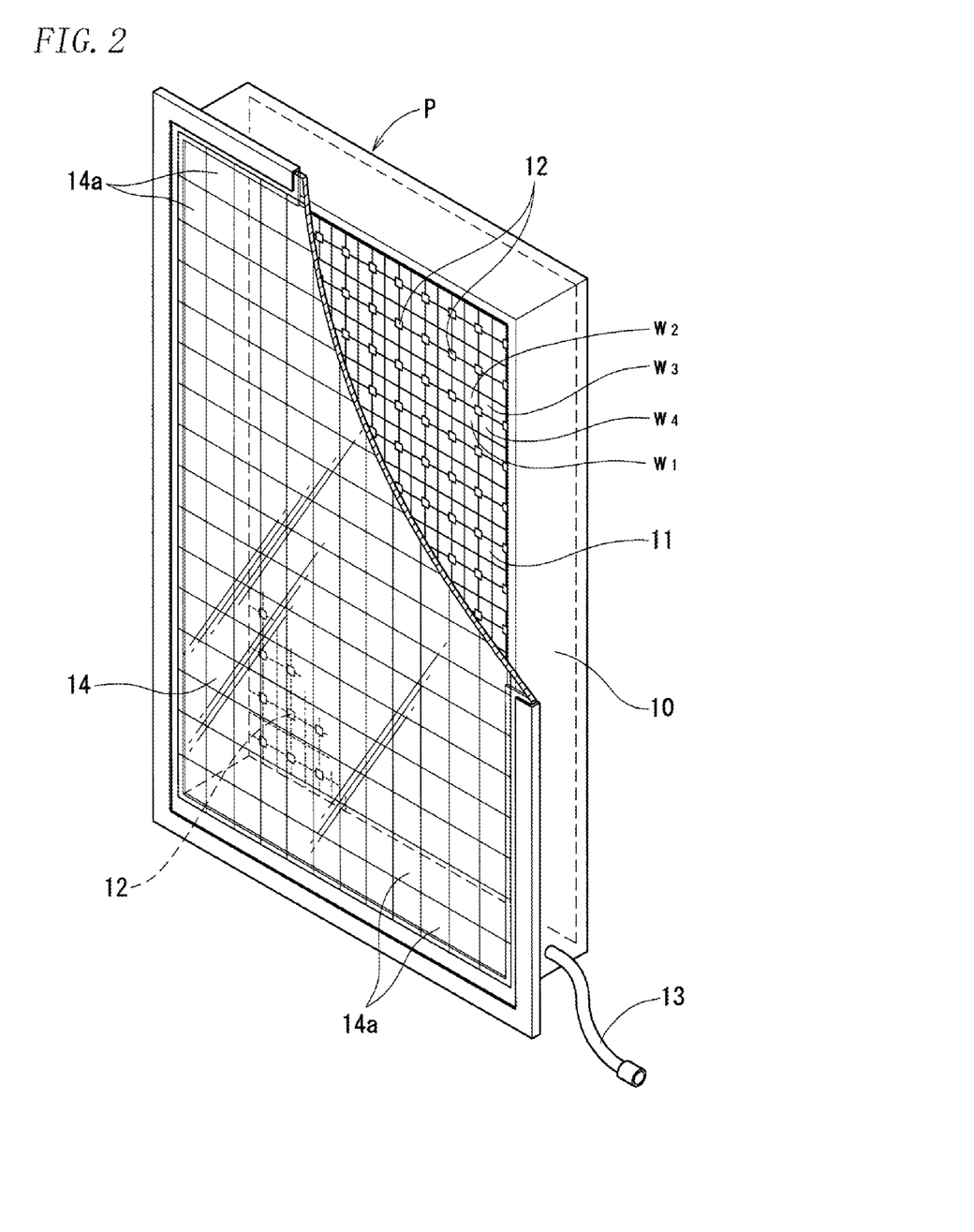
FIG. 2 is a perspective view, partially broken away, of a photovoltaic power generation panel.

Referring to FIG. 2, in the concentrator photovoltaic panel, each solar cell 12 is provided with respect to each concentrating lens 14a. For example, in Japan, direct sunlight which is approximately 70% of sunlight radiating the concentrating lens 14a is gathered (concentrated) by the concentrating lens 14a and radiates the solar cell 12 to generate power, and scattering sunlight which is the remaining approximately 30% of the sunlight radiates the periphery of the solar cell 12. At this time, the concentrated position is misaligned due to lowered sun tracking accuracy to cause failure at the periphery of the solar cell 12. Therefore, to eliminate such a failure, a protective cover in which only the light receiving portion of each solar cell 12 has a through hole is provided on the entire light receiving surface (a back side of a concentrating plate 14) (the entire surface at the periphery of the solar cell 12 is covered with the protective cover).

There is also a technique in which light emitting devices having various colors are provided in a photovoltaic power generation panel to have displayability and decorativeness (see paragraph 0022 and the like in Patent Literature 2).

CITATION LIST

Patent Literature

Patent Literature 1: Japanese Unexamined Patent Publication No. 2002-289896
Patent Literature 2: Japanese Unexamined Patent Publication No. 2005-116834

SUMMARY OF INVENTION

Technical Problem

The typical photovoltaic power generation panel in which the entire light receiving surface thereof is black has no decorativeness and is not excellent in appearance.

In addition, in the technique in which light emitting devices are provided to have displayability and decorativeness, the displayability depends only on the light emitting devices, and the photovoltaic power generation panel of the technique is not of a concentrating type, with the result that the displayability is hardly changed according to the direction in which the panel is seen, thereby being lacking in fun.

An object of the present invention is to provide a concentrator photovoltaic panel, a concentrator photovoltaic, and a concentrator photovoltaic system, which make full use of the characteristic of concentrating lenses to have high displayability and decorativeness.

Solution to Problem

To achieve the above object, in the present invention, firstly, it has been noted that in the concentrator photovoltaic panel, scattering sunlight radiates the periphery of each solar cell and is reflected, so that the reflective surface can be seen (identified) through each concentrating lens.

Next, it has been noted that an object on the rear surface of each concentrating lens is seen differently according to the direction in which the panel is seen from the front surface of the lens.

In the present invention, it has been noted that the surface on which scattering sunlight is reflected can be seen through each concentrating lens and an object which can be seen is different according to the direction in which the reflective surface is seen, and in order for an image which is seen through each concentrating lens from a plurality of directions with respect to the light receiving surface of the panel, e.g., from the respective directions, such as the obliquely downward right direction and the obliquely upward left direction, to be different, portions of the image are imaged at the periphery of each solar cell. In other words, when the light receiving surface of the panel is seen from a plurality of directions, portions (pixels) of intended images which can be identified (seen) from the respective directions are imaged at the periphery of each solar cell, so that the respective images can be identified through the light receiving surface from the respective directions as the collection of portions thereof at the periphery of the solar cell.

In this way, when an image which can be visually identified from the direction in which the panel is seen, e.g., a letter or a picture, is changed, the photovoltaic power generation panel is different from the conventional ones, so that the photovoltaic power generation panel has various displayability and decorativeness. In this connection, even when portions of an image at the periphery of each solar cell have one color, the image which can be identified through each concentrating lens has a different color according to the direction in which the panel is seen. Accordingly, the present invention also includes the case where portions of an image at the periphery of each solar cell have one color.

There can be adopted a concentrator photovoltaic panel of the present invention in which a plurality of basic power generation structures each having a substrate, a solar cell provided on the substrate and converting light to electricity, and a concentrating lens arranged above the solar cell are arrayed and integrated, wherein a colored member is arranged in a portion other than the solar cell on the substrate in each of the basic power generation structures, thereby using, as one pixel, the colored member in the basic power generation structure to form an image on the entire panel.

Electric solar cells of various types can be adopted, but as a concentrating type, each solar cell preferably includes a compound semiconductor; for example, the compound semiconductor can be a III-V compound.

Concentrating lenses of various types, such as a convex lens, can be adopted, but a Fresnel lens which can be thinned is preferable.

As means for coloring the colored member, the color (image) thereof is generally provided to the substrate, but in the concentrator photovoltaic panel which is provided with the protective cover at the periphery of each solar cell, the image is imaged on the cover. The cover may be a plate on which the image is imaged, not for protecting the periphery of each solar cell. The plate is not limited to the form in which only the light receiving portion of each solar cell has a through hole, and has any size and shape if the image can be imaged thereon.

The image is imaged by paint, for example, but the paint having a high heat dissipation function is preferably used.

In this configuration, the color of the surface of the colored member can be different between the basic power generation structures, and the surface of the colored member can be subjected to equal division in each of the basic power generation structures so that coloring is provided to each of divided regions, thereby making an image different on the entire panel according to the direction in which the panel is seen.

In addition, as the colored member, a light emitting device can also be arranged, and a reflecting member can also be arranged on a portion other than the light emitting device on the substrate. With this, not only in the daytime, but also in the nighttime in which there is no sunlight, each image can be represented by the illumination of the light emitting device. The reflecting member reflects the illumination to increase brightness.

Electric power for the light emitting device, a battery is added to the panel, power in the daytime obtained by each solar cell is stored in the battery, and the stored power can be used. The light emitting device includes, not only a light emitting diode, but also all members which illuminate by themselves to have displayability and decorativeness. The light emitting device also includes a member such as a liquid crystal display which illuminates using backlight and reflection.

The reflecting member can be the colored member and can be a member such as a mirror which is different from the colored member. When the entire surface of the reflecting member has one color, any color, such as white, blue, and green, can be used, but white is preferable. In addition, the number of light emitting devices in place of the colored members in each of the basic power generation structures is not limited to one and may be a number necessary for substituting the light emitting devices for the colored members, and when a plurality of light emitting devices are used, the illuminating color thereof may also be different.

Figure 1:
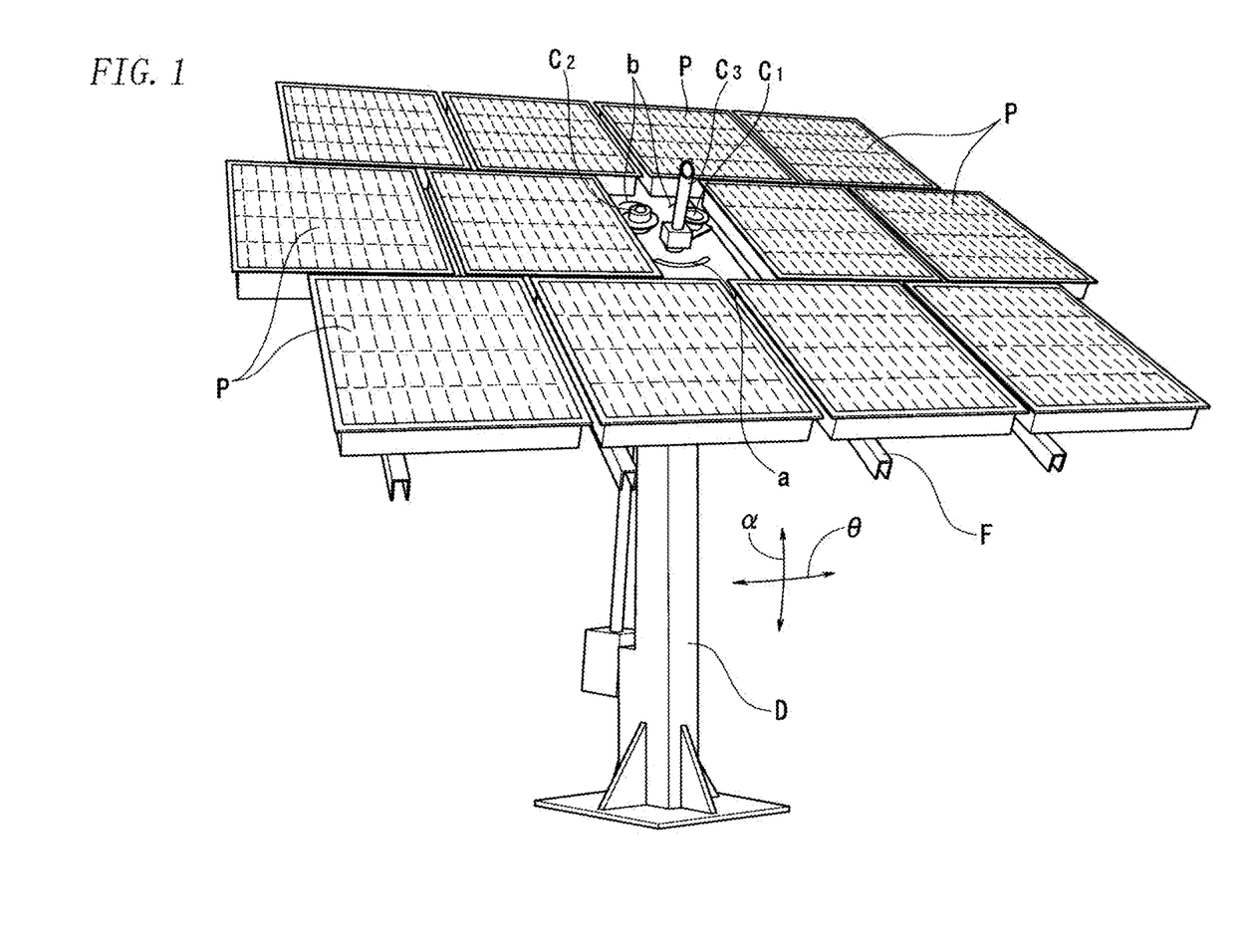
FIG. 1 is a perspective view of an example of a concentrator photovoltaic according to the present invention.

A plurality of concentrator photovoltaic panels which are arranged vertically and horizontally may be the concentrator photovoltaic (facility) shown in FIG. 1, a mega-solar system gathering the concentrator photovoltaics (concentrator photovoltaic system), or the like. At this time, each of the concentrator photovoltaic panels can form a partial image, and all the concentrator photovoltaic panels can form one image. In addition, each of the concentrator photovoltaic panels can represent an image, a certain group of the concentrator photovoltaic panels can represent one image and the remaining concentrator photovoltaic panels can represent a different image, and a plurality of groups of the concentrator photovoltaic panels can represent different images, respectively.

A plurality of concentrator photovoltaic panels which installed on an installation supporting portion can be the concentrator photovoltaic, which has means for driving the installation supporting portion and means for capturing a position of the sun, thereby enabling each of the concentrator photovoltaic panels to be driven so that the light receiving surface of the concentrator photovoltaic panel is opposite to position of the sun.

In addition, if a plurality of concentrator photovoltaics are provided, the concentrator photovoltaic system can be obtained, and one image can be formed with all of the plurality of concentrator photovoltaics (concentrator photovoltaic system). Further, each of the concentrator photovoltaics can represent an image, a certain group of the concentrator photovoltaics can represent one image and the remaining concentrator photovoltaics can represent a different image, and a plurality of groups of the concentrator photovoltaics can represent different images, respectively. At this time, the photovoltaic power generators can form one large image when seen from the sky, and one or more small images when seen on the ground.

With the installation supporting portion, each of the concentrator photovoltaic panels has a sun tracking function, so that when the photovoltaic power generation panel is seen from the same position, an image which can be identified (seen) with the change in the direction in which the photovoltaic power generation panel faces the sun (sun tracking) is different. For example, since the photovoltaic power generation panel faces the sun with the movement of the sun, at the time of seeing the panel from the same position, a different advertisement can be displayed in the morning, afternoon, and evening. For example, "Good morning" can be displayed in the morning, and "Welcome home" can be displayed in the evening. In addition, for example, to a person in a train passing through the same place, a greeting such as "Good morning, Have a nice day!" in the morning, "It will be lunch time soon!" before noon, "It's time to get back to work!" in the afternoon, and "Take care on your way home." in the evening, and a message such as "Safety", "Quality", "Environment", and "Development" can be displayed.

The concentrator photovoltaic panel which has the light emitting devices can represent, not only various patterns thereof, e.g., an advertisement, a commercial, and a character, but also a starry sky, even in the nighttime.

Advantageous Effects of Invention

As described above, with the characteristic of the concentrating lenses, a different image can be identified according to the direction in which the panel is seen, so that the present invention can be the concentrator photovoltaic panel, the concentrator photovoltaic, and the concentrator photovoltaic system, which have high displayability (messageability) and decorativeness. In other words, the present invention can have, not only the solar photovoltaic power generation panel, but also a message board function. At this time, when portions of an image are imaged by paint or the like which reflects light received from others to have displayability and decorativeness, the displayability and the decorativeness can be obtained at low cost.

DESCRIPTION OF EMBODIMENTS

The present invention provides a concentrator photovoltaic panel in which concentrating lenses are arranged vertically and horizontally and solar cells are arranged on the back side of the concentrating lenses (on the opposite side of the sun), wherein in order for an image of the entire light receiving surface seen through each of the concentrating lenses from a plurality of directions with respect to the light receiving surface, to be different, portions of the different image are imaged at the periphery of each of the solar cells. The present invention is adopted in, e.g., a concentrator photovoltaic having a plurality of photovoltaic power generation panels P arrayed vertically and horizontally, shown in FIG. 1.

In the concentrator photovoltaic, a lattice-shaped frame F is mounted on a sun tracking base D so as to be rotatable by an electric motor with respect to the sun tracking base D in the right-left direction (about an axis of the sun tracking base D) and in the up-down direction (along an axis of the sun tracking base D), and the concentrator photovoltaic panels P are arranged on the frame F vertically and horizontally. Any number of photovoltaic power generation panels P arrayed vertically and horizontally may be provided. In addition, a plurality of concentrator photovoltaics may be arrayed vertically and horizontally to provide a concentrator photovoltaic system (facility). Any number of photovoltaic power generators arrayed vertically and horizontally may be provided.

Preferably, each of the concentrator photovoltaic panels P is, e.g., 850 cm long, 650 cm wide, and 70 cm thick, and preferably has a size and a weight in which the panel P can be carried by one person (light weight and reduced thickness). In addition, with the size to this extent, application of the production technique of thinned televisions, LED lighting instruments, and the like in Japan enables a reduced manufacturing cost of each concentrating plate 14 and cost reduction by automation mounting of each solar cell 12.

A solar azimuth meter (sun tracking meter) C1, a pyranometer C2, and a direct sunlight meter C3 are arranged at the center portion of the panels P. The position (direction) of the sun is identified by the solar azimuth meter C1, and then, based on an identification signal, the frame F is moved in the right-left direction and in the up-down direction so as to be controlled to a rotation angle θ and an elevation angle α in which the frame F straightly faces the sun. In other words, the frame F tracks one-day movement of the sun at all times so as to be controlled to the direction angle (rotation angle θ) at which the light receiving surface of each of the solar photovoltaic power generation panels P is movable from the east direction to the west direction. In addition, the frame F tracks the change in the altitude of the sun in one day from sunrise in which the altitude of the sun is low through midday in which the altitude is high to sunset in which the altitude is low again so as to be controlled to the elevation angle at which the light receiving surface of each of the photovoltaic power generation panels P is movable in the elevation angle direction (elevation angle α). Further, to make power generation efficiency the best, each of the photovoltaic power generation panels P (light receiving surface) faces the sun straightly (at right angle) (the light receiving surface is opposite to the sun).

In addition, a solar radiation amount of the sky is detected by the pyranometer C2, a solar radiation amount of the direct sunlight is detected by the direct sunlight meter C3, and the detection amounts and a power generation amount are compared to calculate the power generation efficiency.

Patterns a and b corresponding to a mouth and eyebrows are provided around these three of the solar azimuth meter C1, the pyranometer C2, and the direct sunlight meter C3. With the patterns a and b, for personification, the solar azimuth meter C1 and the pyranometer C2 correspond to the eyes of a human being and the direct sunlight meter C3 corresponds to the nose thereof. In addition, the solar azimuth meter C1, the pyranometer C2, and the direct sunlight meter C3 are arranged at the center portion of the photovoltaic power generation panels P arrayed vertically and horizontally, which reduces misalignment of the meters C1, C2, and C3 with respect to the entire frame (the misalignment in the detection direction) based on warp of the frame F with time, whereby the deterioration in detection accuracy is less.

Figure 3:
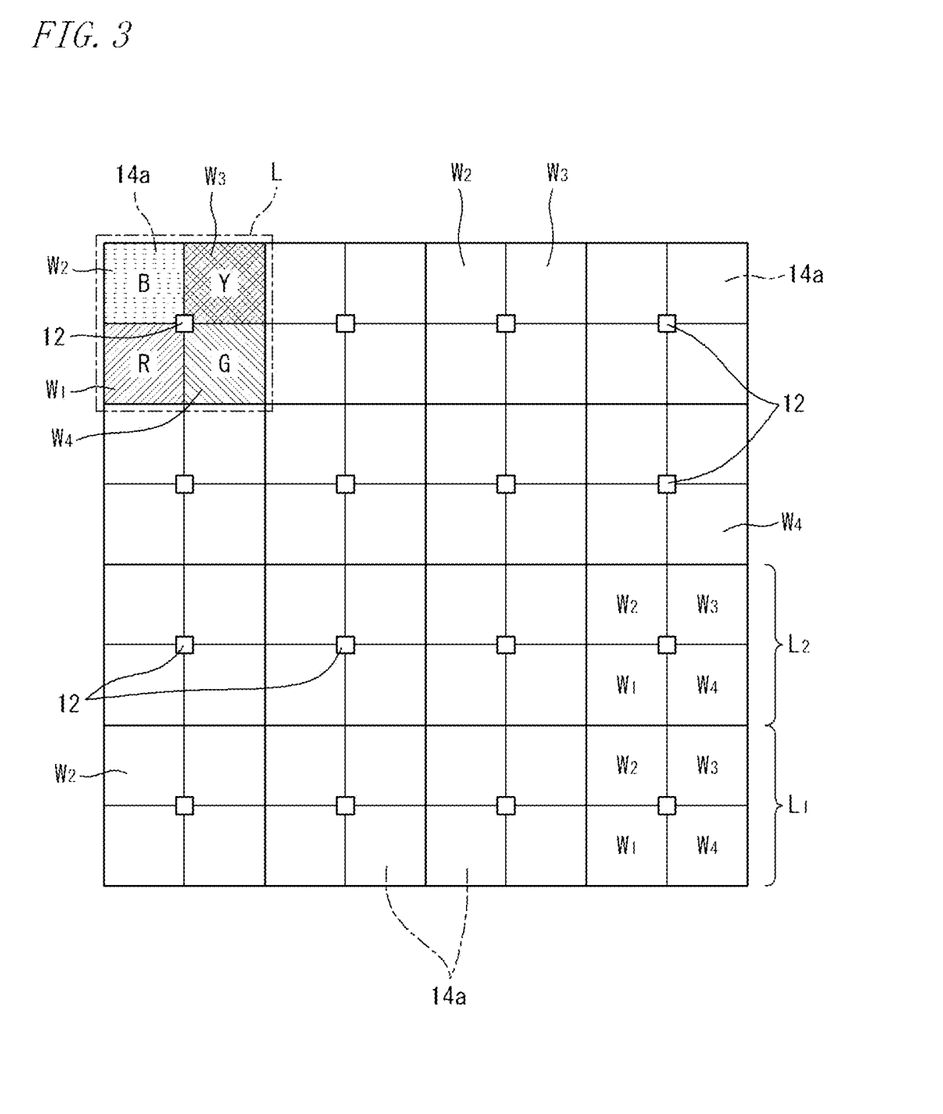
FIG. 3 is a plan view of an essential part of an embodiment of the present invention.

As shown in FIG. 2, in the photovoltaic power generation panel P, a high heat dissipation substrate 11 is provided in a square shaped-metal box frame 10. On the substrate 11, small-type solar cells (e.g., in a square shape measuring 5 mm per side) 12 each including a III-V compound semiconductor are arranged vertically and horizontally. In this example, as shown in FIG. 2 and FIG. 3, a substrate on which 16 solar cells 12 are vertically arranged in series on a straight line with equal spacing is one unit, and 12 units are mounted in parallel on the high heat dissipation substrate 11.

The front surface of the box frame 10 is covered with the concentrating plate 14 in which concentrating lenses (e.g., in a square shape measuring 5 cm per side) 14a each including a Fresnel lens are arranged in length and width (16: length× 12: width), and the center of each of the concentrating lenses 14a is opposite to each of the solar cells 12. Therefore, most of sunlight (i.e., direct sunlight) concentrated by the concentrating lens 14a radiates the solar cell 12 to perform efficient power generation. On the other hand, scattering sunlight of the sunlight is reflected at the periphery of the solar cell 12, so that an image at the periphery thereof is identified. In the figure, reference numeral 13 denotes a cable which guides power generated by the concentrator photovoltaic panel P to the outside. In this example, 4×3 concentrating plate sections each integrally forming 4×4 concentrating lenses 14a are arranged to form the concentrating plate 14, but any number of concentrating lenses 14a arranged vertically and horizontally in each of the concentrating plate sections and any number of concentrating plate sections can be determined according to the size and shape of the concentrating plate 14.

In this connection, when such photovoltaic power generation panels have the same power generation efficiency and the same light receiving surface size, they have the same solar radiation amount and the same power generation amount. In this example, 192 (16×12) small-type solar cells 12 are arranged on the concentrating plate 14 which is 850 cm long, 650 cm wide, and 70 cm thick. With this, as compared with the photovoltaic power generation panel provided with e.g., 48 large-type solar cells on the light receiving surface having the same size as above, a space at the periphery of each of the solar cells 12 is increased, so that heat dissipation from the substrate 11 is increased.

In the present invention, in such a concentrator photovoltaic panel P, portions of a different image W are formed at the periphery of each of the solar cells 12, and the image W seen through each of the concentrating lenses 14a from a plurality of directions with respect to the entire surface (light receiving surface) of the photovoltaic power generation panel P is different. In other words, the image W formed by collecting portions thereof through the concentrating lens 14a seen from one direction has displayability such as "Good morning", an "advertising letter", and an "advertising picture", and decorativeness such as a "flower pattern". At this time, when there is a protective cover on the high heat dissipation substrate 11 or at the periphery of the solar cell 12, the image W is imaged on the cover by paint or the like. In this embodiment, the image W is imaged on the substrate 11, but in the conventional form in which the image W is imaged on the protective cover, in FIG. 2, the plate on which the image (pixels w) is imaged becomes the protective cover, and the substrate 11 is located thereunder. Then, the protective cover is formed with a through hole located in a position in which the center of each of the concentrating lenses 14a is opposite to, so that light concentrated by the concentrating lens 14a passes through the through hole to radiate each of the solar cells 12.

Figure 4:
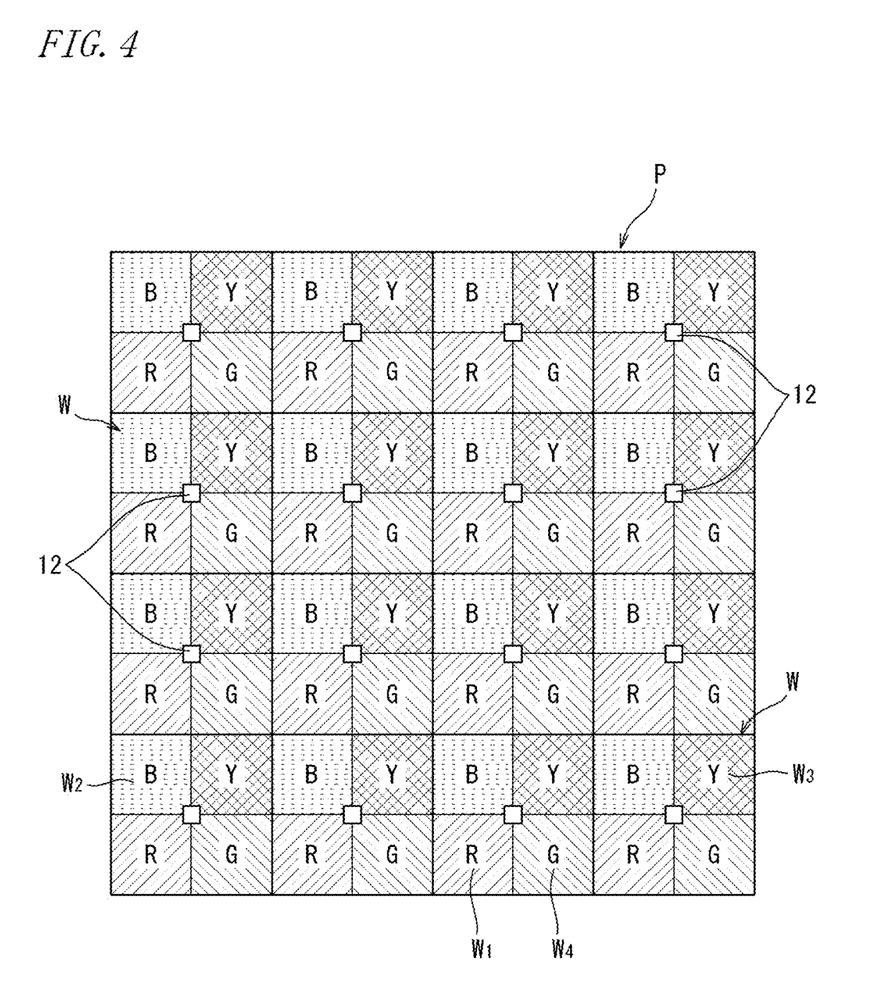
FIG. 4 is a plan view of an essential part of colored members of the embodiment.

For example, as shown in FIG. 3, in the image W, one solar cell 12 and one concentrating lens 14a corresponding to the solar cell 12 are one unit, the periphery of the solar cell 12 of the unit is equally sectioned into four in the up-down direction and in the right-left direction, and colors w1, w2, w3, and w4 of "R (red)", "B (blue)", "Y (yellow)", and "G (green)" are provided to the four divided portions (see the upper left end of FIG. 3). In this case, the portions corresponding to each of the concentrating plate sections in the frame 10 in one photovoltaic power generation panel P are colored as in FIG. 4.

In this connection, in this example, the different image W can be obtained from four directions of the right, left, up, and down directions, so that it can also be considered that as a display device (decorating device), four colored portions at the periphery of one solar cell 12 form w1, w2, w3, and w4 which are portions of each image, thereby forming the pixels thereof. The collected pixels (four pixels w1, w2, w3, and w4) and the solar cell 12 form one basic power generation structure L in the claims, and the pixels w1, w2, w3, and w4 become the colored members in portions other than the solar cell 12.

Figure 5:
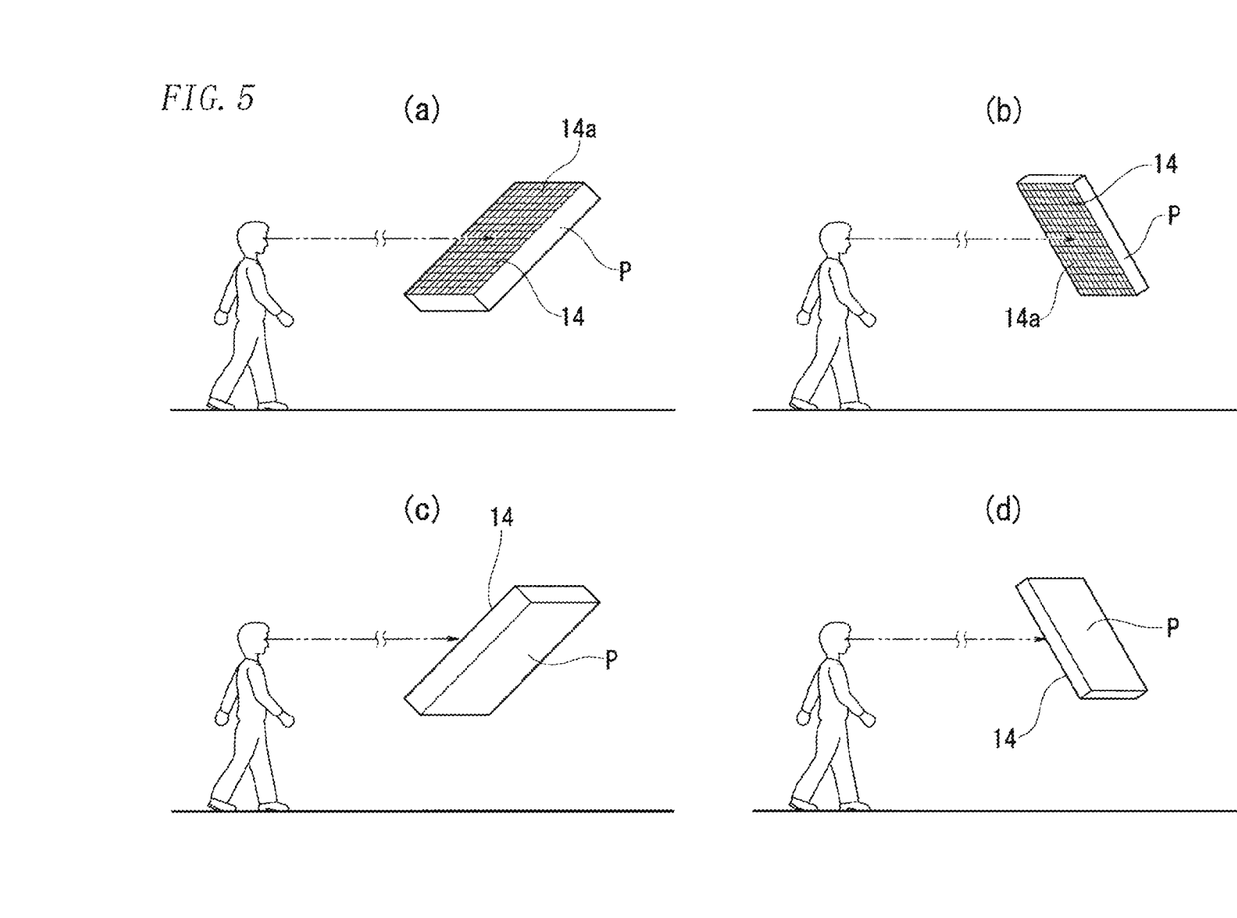
FIG. 5 is an operation explanatory view of the embodiment.

In the photovoltaic power generation panel P in which the colors are arranged in this manner, for example, when the vertical panel P is seen from a position which is about 10 meters away from the panel P, the lines of vision to the concentrating lens 14a are considered to be substantially parallel. Accordingly, for example, as shown in FIG. 5(a), when the panel P is tilted upward to the right, the person sees the panel P from the lower left direction with respect to the center vertical axis thereof and can identify only yellow (only yellow appears). As shown in FIG. 5(b), when the panel P is tilted downward to the right, the person sees the panel P from the upper left direction and can identify only green (only green appears). As shown in FIG. 5(c), when the panel P is tilted upward to the left, the person sees the panel P from the lower right direction and can identify only blue (only blue appears). As shown in FIG. 5(d), when the panel P is tilted downward to the left, the person sees the panel P from the upper right direction and can identify only red (only red appears).

At this time, according to a tilt angle of the panel P (an angle at which the person sees the panel P), when the basic power generation structure corresponding to one concentrating lens 14a is the portion L surrounded by the chain line at the left corner of FIG. 3, an image seen through the concentrating lens 14a does not include all of the pixels w1, w2, w3, and w4 of the basic power generation structure L. For example, when the panel P is seen through the concentrating lens 14a corresponding to the basic power generation structure portion L1, visible pixels are not limited to those in the basic power generation structure portion L1. The pixels w2 and w3 of the L1 and the pixels w1 and w4 of the L2 may be identified, or, the pixels w1, w2, w3, and w4 of the L2 may be identified. Therefore, in accordance with orientation of the panel P, combination of visible pixels in the panel P is changed. That is, plural kinds of images are formed on the panel P in accordance with the place where the person sees the panel P. In case that the person sees the panel P following the sun at the same place, the image formed on the panel P varies as time goes by.

Further, each of the solar cells 12 can be identified only when the panel P is straightly seen (when the panel P is seen from the sunlight direction), so that when the panel P is seen diagonally from the lower left direction, the solar cell 12 cannot be seen. In other words, although the solar cell 12 is black and very small, its black (black point) is hardly seen when the respective other colors are seen, so that most of the visual influence of the solar cell 12 on the image can be neglected.

As can be seen from the above, the color arrangement pattern or the like at the periphery of each of the solar cells 12 is changed, so that the identifyable (appearing) image (such as a letter) W is changed according to the direction in which the entire surface (light receiving surface) of the panel P is seen.

Figure 6:
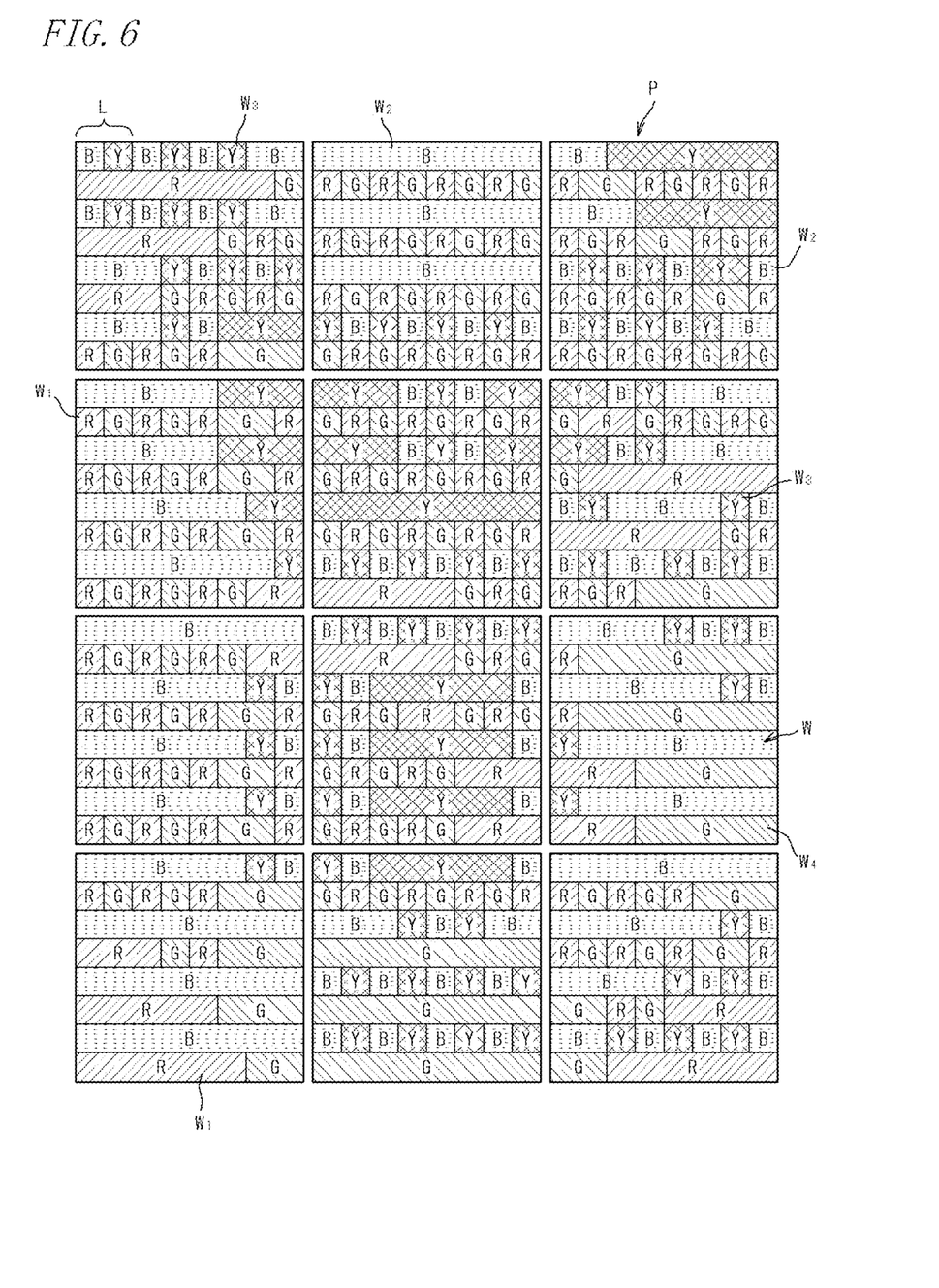
FIG. 6 is a plan view of colored members in one concentrator photovoltaic panel of another embodiment.
Figure 7:
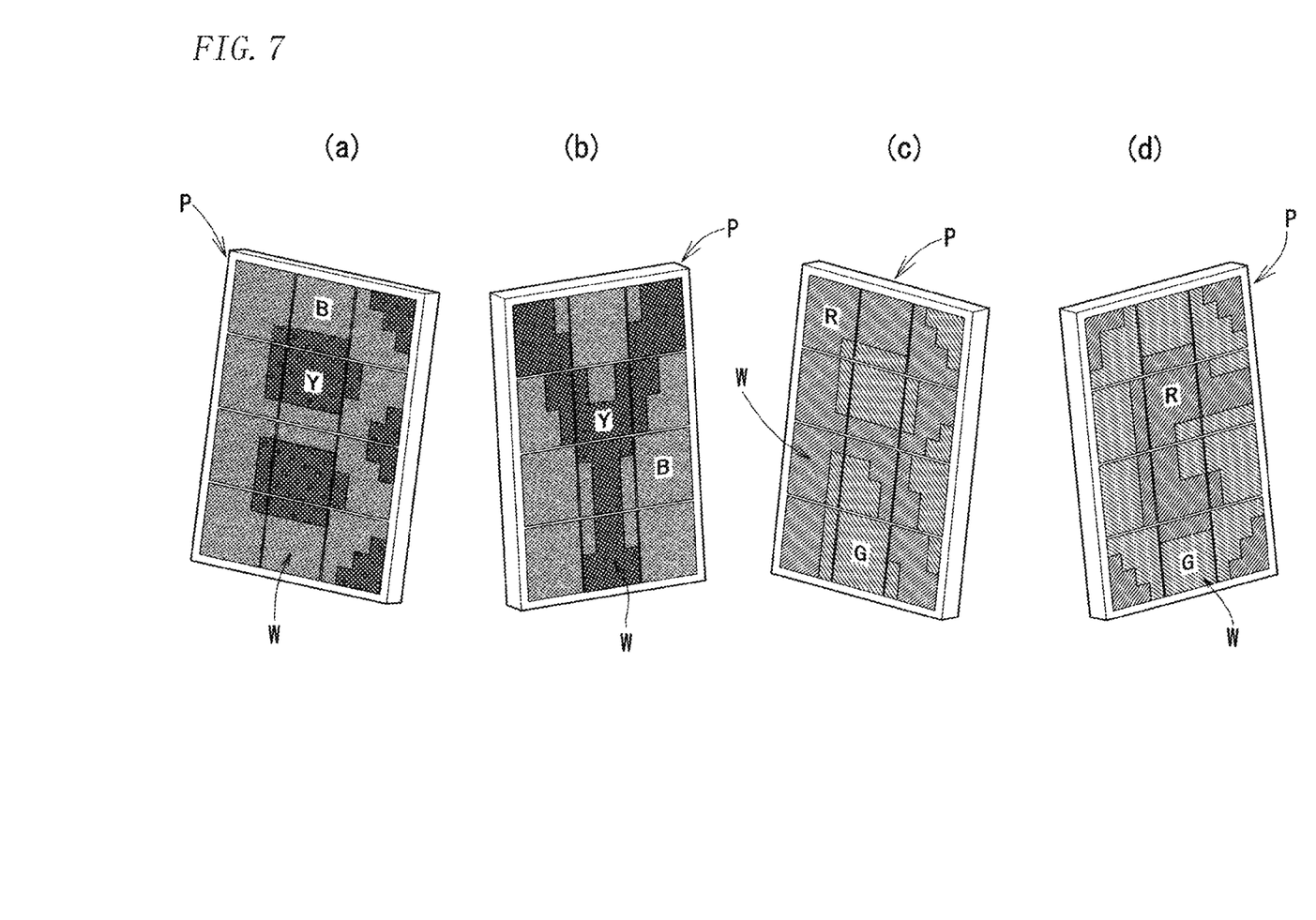
FIG. 7 is an operation explanatory view of the embodiment.

Therefore, for example, in one panel P, as shown in FIG. 6, the colored members w1, w2, w3, and w4 of "R (red)", "B (blue)", "Y (yellow)", and "G (green)" are provided to each of the basic power generation structures L in the frame 10 (similarly to FIG. 3, four frames (four colored portions) form the pixels at the periphery of one solar cell 12), so that when the panel P is seen from the lower right direction, as shown in FIG. 7(a), a pattern which represents a letter "B" in blue in which the periphery thereof is yellow can be identified (the letter B appears). When the panel P is seen from the lower left direction, as shown in FIG. 7(b), a pattern which represents a letter "Y" in yellow in which the periphery thereof is blue can be identified (the letter Y appears). When the panel P is seen from the upper right direction, as shown in FIG. 7(c), a pattern which represents a letter "R" in red in which the periphery thereof is green can be identified (the letter R appears). When the panel P is seen from the upper left direction, as shown in FIG. 7(d), a pattern which represents a letter "G" in green in which the periphery thereof is red can be identified (the letter G appears). It is to be noted that four kinds of examples are shown herein, but the present invention is not limited thereto.

Figure 8:
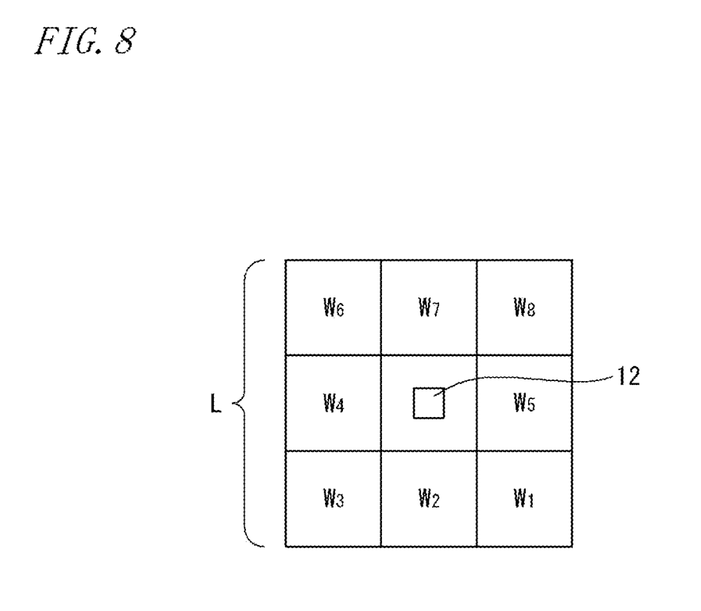
FIG. 8 is a plan view of an essential part of colored members of still another embodiment.

In addition, as shown in FIG. 8, one basic power generation structure L is equally divided into three in the vertical or horizontal direction, and one solar cell 12 is arranged at the center thereof. Further, in the eight divided portions at the periphery of the solar cell 12, "red" is provided to the pixel w1, "green" is provided to the pixel w2, "gray" is provided to the pixel w3, "white" is provided to the pixel w4, "sky-blue" is provided to the pixel w5, "blue" is provided to the pixel w6, "yellow" is provided to the pixel w7, and "pink" is provided to the pixel w8.

When the vertical panel P is seen from the position which is approximately 10 meters away from the panel P, it can be identified that the entire light receiving surface is seen in the following colors according to the tilt of the panel P.

When the panel is tilted upward to the left.→"blue" When the panel faces upward without being tilted in the right-left direction.→"yellow"

When the panel is tilted upward to the right.→"pink"

When the panel is tilted to the left without facing the up-down direction.→"white"

When the panel is tilted to the right without facing the up-down direction.→"sky-blue"

When the panel is tilted downward to the left.→"gray"

When the panel faces downward without being tilted in the right-left direction.→"green"

When the panel is tilted downward to the right.→"red"

Figure 9:
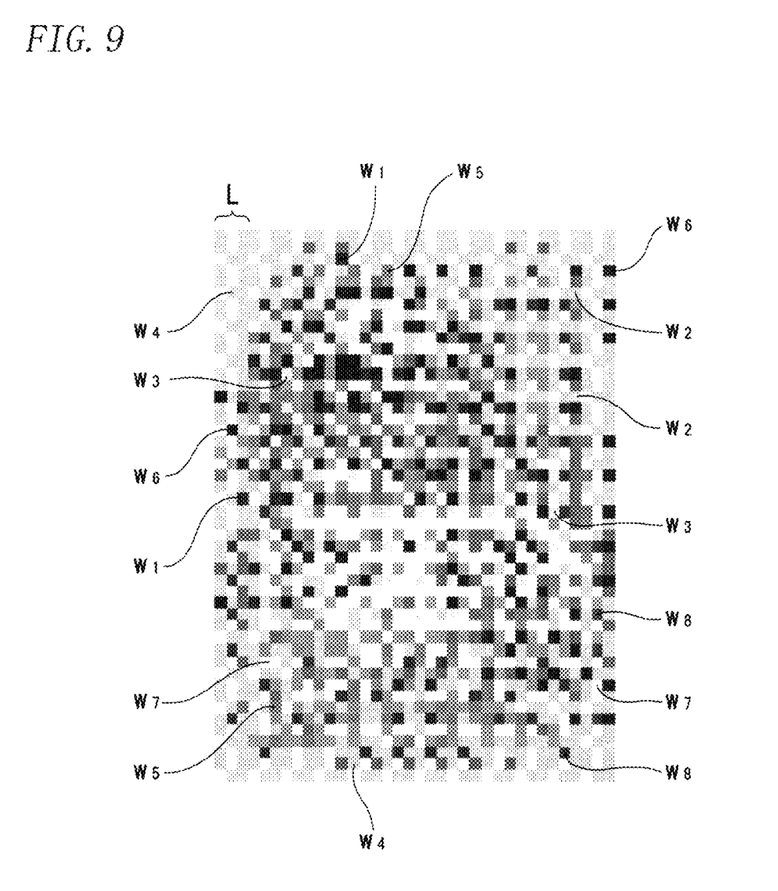
FIG. 9 is a plan view of the colored members in one concentrator photovoltaic panel of the embodiment.
Figure 10:
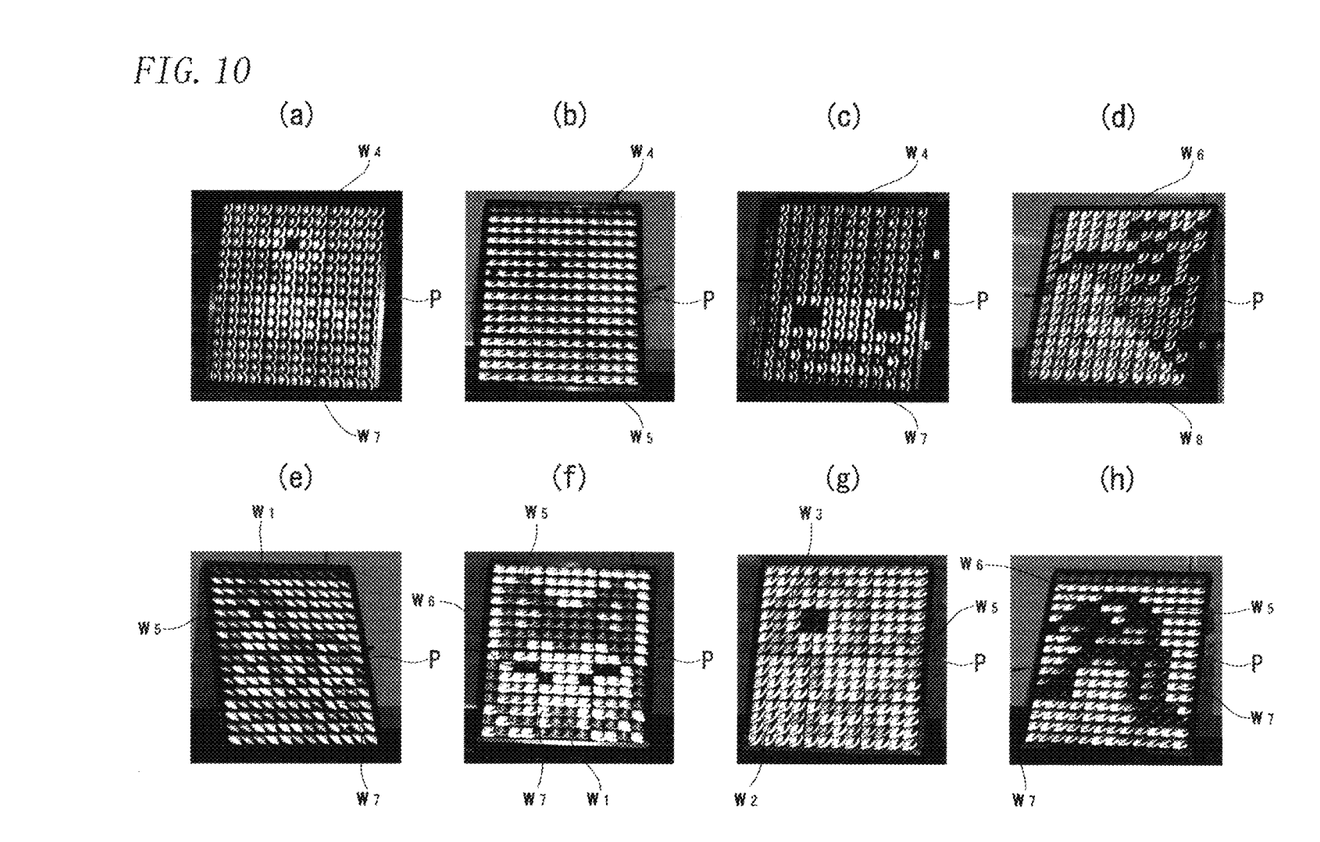
FIG. 10 is an operation explanatory view of the embodiment.

Further, in FIG. 8, when various colors are provided as shown in FIG. 9 (the pixel w1: red, the pixel w2: blue, the pixel w3: yellow, the pixel w4: green, the pixel w5: orange, the pixel w6: black, the pixel w7: white, and the pixel w8: brown are formed), the images of (a) to (h) in FIG. 10 can be obtained. In other words, when the panel P is seen from the upper left direction, a "duck" of FIG. 10(*a*) can be identified. When the line of vision is gradually moved from this state to the right (or to the right with respect to the panel P), first, a "fox" of FIG. 10(*b*) can be identified. Further, when the line of vision passes a position straight with respect to the panel P, a "rabbit" of FIG. 10(*c*) can be identified, and then, a "whale" of FIG. 10(*d*) can be identified. Likewise, when the panel P is seen from the lower left direction, a "chicken" of FIG. 10(*e*) can be identified. When the line of vision is gradually moved from this state to the right (or to the right with respect to the panel P), first, a "cat" of FIG. 10(*f*) can be identified. Further, when the line of vision passes a position straight with respect to the panel P, a "chick" of FIG. 10(*g*) can be identified, and then, a "penguin" of FIG. 10(*h*) can be identified. Further, in the images, the mixed color of the pixels w1, w2, w3, w4, w5, w6, w7, and w8, e.g., pink can be identified, if necessary.

As can be seen from the above, to create the pixel w in each of the basic power generation structures L of each image W, the pixel w corresponding to the image W seen from each direction is allocated in a portion (divided portion) of the basic power generation structure. For example, in the case of the "chick", the pixel w of the image W of the "chick" is allocated in a portion of the basic power generation structure L which can be seen.

Figure 11:
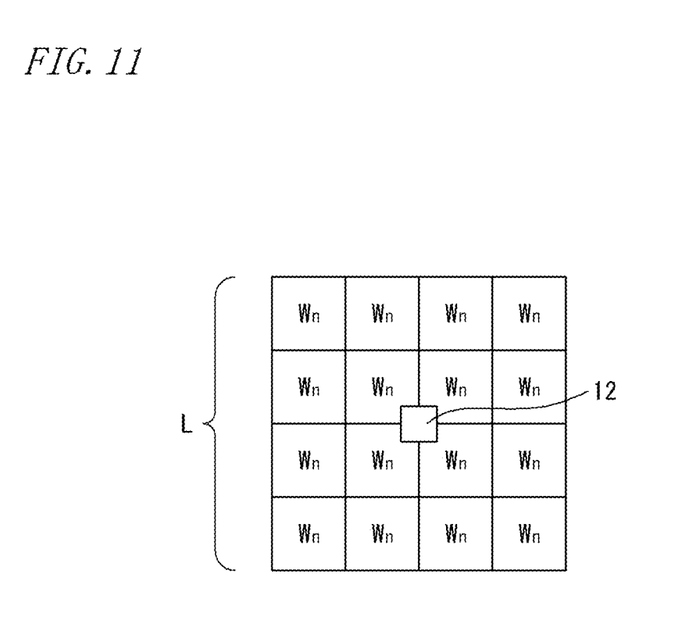
FIG. 11 is a plan view of an essential part of colored members of yet another embodiment.

In addition, any number of divisions of the basic power generation structure L is provided in such a manner that the basic power generation structure L is equally divided into 4, 9, 16, 25, 36, . . . in the vertical or horizontal direction, the number of divisions of the basic power generation structure L in the vertical or horizontal direction is different, or the basic power generation structure L is not subjected to equal division. The identifyable image W is different according to the degree of divisions. When the number of divisions is an odd number such as 9, 25, the solar cell 12 should be provided in the center divided box (see FIG. 8). However, when the number of divisions is an even number such as 16, 36, there is no center divided box, so that for example, as shown in FIG. 3 and FIG. 11, a predetermined space is formed at the corners of the four center divided boxes (pixels wn, n=1, 2, 3 . . . ) to provide the solar cell 12 therein. At this time, coloring is provided to the four divided boxes in which the solar cell 12 is provided, thereby forming the pixels wn. In addition, in the center divided box when the number of divisions is an odd number, coloring is provided to a space other than the solar cell 12 to form the pixels w.

When the colored portions of the basic power generation structure L are not subjected to equal division (unequal division) at the periphery of the solar cell 12, the image can be identified to be longer (for a long time) in a certain angle range depending on the angle at which the image is seen, and can be identified to be shorter (for a short time) in a certain angle range depending on the angle at which the image is seen. In addition, when the angle at which the image is seen is continuously changed irrespective of equal division and unequal division, the pixels w become the same as frame advance, so that a moving image showing a human being running or the like can also be identified. Further, a plurality of colored pixels having a plurality of concentric circles about the solar cell 12 can be provided, and any color may be provided.

Further, when the entire surface (colored members) of the high heat dissipation substrate 11 at the periphery of the solar cell 12 has the same color, an owner of the concentrator photovoltaic, e.g., "light blue (sky-blue)" which is the image color of the present applicant can be represented. In addition, when the pixels which are overlappingly seen can be identified, they are identified as a neutral color, thereby obtaining a gradation effect in which the colors are changed with movement of the photovoltaic power generation panel P.

In addition, when one pixel w of one image W is formed in the respective divided portions of the basic power generation structure L, the divided portions have the same pixel, so that even when the panel P is tilted, the same image can be identified at all times.

In this way, in each of the photovoltaic power generation panels P in the concentrator photovoltaic of FIG. 1, different letters are represented when the panel P is seen from a plurality of directions such as the up, down, right, and left oblique directions; for example, the photovoltaic power generation panel P is swung in the right-left direction and in the up-down direction with the movement of the sun, so that different letters are identified (displayed) from the person at a position in front of the sun tracking base D. For example, when the panel P is tilted forward to the left in the morning, the panel P is identified from the upper right direction; when the panel P is tilted upward to the left before noon, the panel P is identified from the lower right direction; when the panel P is tilted upward to the right in the afternoon, the panel P is identified from the lower left direction; and when the panel P is tilted forward to the right in the evening, the panel P is identified from the upper left direction.

Therefore, when letters according to the directions are represented, for example, a greeting such as "Good morning. Have a nice day!" in the morning, "It will be lunch time soon!" before noon, "It's time to get back to work!" in the afternoon, "Take care on your way home." in the evening can be displayed. At this time, the number of letters displayed on one panel P is not limited to one, and two, and three letters may be displayed, and a symbol and a face expression can also be represented.

As can be seen from FIG. 7 and FIG. 10, not only mere letters, but various displays such as a face mark, a picture of Mt. Fuji, and an advertisement can be displayed. For example, a mega solar system which has a large light receiving area corresponding to an area of a swimming pool can represent an image in which the Nazka Lines are designed. In addition, frame advance moving images can be identified (represented).

Further, light emitting devices such as LEDs are provided in the photovoltaic power generation panel P and in any panel P of the photovoltaic power generator or the photovoltaic power generation system, power generated in the daytime is stored in a battery, and in the nighttime in which no power is generated, the power from the battery can represent the same message and decoration as the conventional ones with the illuminating colors of the light emitting devices. At this time, the illuminating colors of the light emitting devices form portions w1, w2, w3, w4, . . . of the image W, so that when the light receiving surface of the panel P is seen from a different direction, the different image W can be identified (seen). For example, in each of the colored portions such as red, blue, yellow, and green in FIG. 4, FIG. 6, and FIG. 9, the light emitting device having the same color is arranged, so that the light emitting device illuminates in the nighttime to enable the same image as above to be identified by the illuminating colors.

In the configuration provided with the light emitting devices, the light emitting devices can be used together with an image imaged by the paint, or alternatively, each image can be represented only by the illuminating colors of the light emitting devices.

In addition, the light emitting devices can be mere lighting members of the image W (the pixels w1, w2, w3, w4, . . . wn) imaged at the periphery of the solar cell 12.

Further, unless there is no trouble in the display of the colored member at the periphery of the solar cell 12, a solar cell made of silicon is arranged to enable power to be generated by scattering sunlight. At this time, the solar cell is colored to represent the same display as the colored member.

In addition, the present invention is not limited to the concentrator photovoltaic in which a plurality of concentrator photovoltaic panels P are provided vertically and horizontally, and needless to say, the present invention can be adopted in the concentrator photovoltaic panel P alone and in the concentrator photovoltaic system in which concentrator photovoltaics are arrayed vertically and horizontally.

From the above, it should be considered that the embodiments disclosed herein are illustrative in all points and are not restrictive. The scope of the present invention is shown in the claims, and is intended to include all changes in the meaning and scope equivalent to the claims.

REFERENCE SIGNS LIST

D: SUN TRACKING BASE OF CONCENTRATOR PHOTOVOLTAIC
F: FRAME OF CONCENTRATOR PHOTOVOLTAIC
P: CONCENTRATOR PHOTOVOLTAIC PANEL
W: IMAGE
w1, w2, w3, w4, w5, w6, w7, w8: PORTION (PIXEL) OF IMAGE
10: BOX FRAME OF PHOTOVOLTAIC PANEL
11: HIGH HEAT DISSIPATION SUBSTRATE
12: SOLAR CELL
14: CONCENTRATING PLATE
14a: CONCENTRATING LENS

The invention claimed is:

1. A concentrator photovoltaic panel in which a plurality of basic power generation structures are arrayed and integrated, each of the basic power generation structures comprising:
    a substrate at a bottom side;
    a solar cell provided on the substrate to convert light to electricity;
    a concentrating lens at a top side arranged above the solar cell to converge sunlight onto the solar cell;
    a protective cover arranged above the substrate to serve as the protective cover for a surface of the substrate except a light-receiving-surface of the solar cell from sunlight, the protective cover having a through hole for passing sunlight being converged by the concentrating lens; and
    a colored member arranged on a top face of the protective cover and around the through hole as a pixel visible through the concentrating lens from an outside of the panel by reflecting a scattering sunlight, that irradiates the colored member on the protective cover, the colored members of all the basic power generation structures forming an image on an entire panel,
    wherein the protective cover is arranged between the colored member and the solar cell,
    wherein the entire color member is on the protective cover.

2. The concentrator photovoltaic panel according to claim 1, wherein the surface of the colored member can be subjected to equal division in each of the basic power generation structures, coloring is provided to each of divided regions, and an image is different on the entire panel according to a direction in which the panel is seen.

3. The concentrator photovoltaic panel according to claim 1, wherein:
    the colored members of each of the basic power generation structures have an individual color pattern arranged on the protective cover with centering the through hole, and
    a visible portion of the colored members from an outside of the panel through the lens is a static pixel varying in dependence upon a direction to view the panel to thereby form an image on the entire panel variable in dependence upon the direction to view the panel.

4. The concentrator photovoltaic panel according to claim 1, wherein a light emitting device is arranged as the colored member.

5. The concentrator photovoltaic panel according to claim 4, wherein a reflecting member is arranged around the light emitting device on the protective cover.

6. The concentrator photovoltaic panel according to claim 1, wherein the solar cell includes a compound semiconductor.

7. A concentrator photovoltaic comprising:
    a plurality of the concentrator photovoltaic panels each according to claim 1; and
    a supporting portion on which the panels are aligned,
    wherein each of the panels forms a partial image, and all the panels form a whole image.

8. The concentrator photovoltaic according to claim 7, wherein:
    the supporting portion includes a sun tracking meter, and
    each of the panels is driven so that a light receiving surface of the panel is opposite to a position of the sun.

9. A concentrator photovoltaic system comprising a plurality of concentrator photovoltaics each identical to the concentrator photovoltaic according to claim 7, wherein all the concentrator photovoltaics form one image.

* * * * *